US012671459B1

(12) United States Patent
White

(10) Patent No.: US 12,671,459 B1
(45) Date of Patent: Jun. 30, 2026

(54) SYSTEM WITH TRANSMIT-RECEIVE SWITCH

(71) Applicant: HRL Laboratories, LLC, Malibu, CA (US)

(72) Inventor: Carson White, Agoura Hills, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 368 days.

(21) Appl. No.: 18/312,965

(22) Filed: May 5, 2023

Related U.S. Application Data

(60) Provisional application No. 63/339,077, filed on May 6, 2022.

(51) Int. Cl.
| | |
|---|---|
| *H04B 1/48* | (2006.01) |
| *H03K 17/0412* | (2006.01) |
| *H03K 17/687* | (2006.01) |
| *H03K 17/689* | (2006.01) |

(52) U.S. Cl.
CPC ......... *H04B 1/48* (2013.01); *H03K 17/04123* (2013.01); *H03K 17/6877* (2013.01); *H03K 17/689* (2013.01)

(58) Field of Classification Search
CPC ......... H03K 17/04123; H03K 17/6877; H03K 17/689; H04B 1/48
See application file for complete search history.

(56) References Cited

U.S. PATENT DOCUMENTS 9,030,054 B2 * 5/2015 Jacobson ................ H02M 1/08
307/115

2006/0084403 A1 4/2006 Gilsdorf et al.
2018/0226932 A1 8/2018 Beaudin et al.
2020/0274575 A1 8/2020 Yang et al.

OTHER PUBLICATIONS

Campbell, C. F. et al., "Wideband High Power GaN on SiC SPDT Switch MMICs", IMS 2010, 2010, pp. 145-148, IEEE.
Imam, M. et al., "Efficacy of GaN-on-Si Technology for Realizing Commercially Viable Monolithic Bi-Directional Switches", IS02.2, Mar. 22, 2022, pp. 1-23.
Kinoshita, Y. et al., "100 A Solid State Circuit Breaker Using Monolithic GaN Bidirectional Switch with Two-Step Gate-Discharging Technique", 2020, pp. 652-657, IEEE.
Lal, R. et al., "GaN Four Quadrant Switches: Ready For Prime Time?", IS02.3, Mar. 22, 2022, 28 pages.
Morita, T. et al., "650V 3.1mΩcm² GaN-based Monolithic Bidirectional Switch Using Normally-off Gate Injection Transistor", 2007, pp. 865-868, IEEE.
Veliadis, V., "Wide-Bandgap Bidirectional Switches and Key Applications", IS02.1, Mar. 22, 2022, pp. 1-34.

* cited by examiner

*Primary Examiner* — Tuan H Nguyen
(74) *Attorney, Agent, or Firm* — Lewis Roca Rothgerber Christie LLP

(57) ABSTRACT

A system with a transmit-receive switch. In some embodiments, the system includes a composite switch. The composite switch may have a common port, a transmit port, and a receive port. The composite switch may include a first simple switch coupled between the common port and the receive port; and a second simple switch coupled between the common port and the transmit port. The first simple switch may be a four-quadrant switch, or the second simple switch may include a field effect transistor, and an isolated gate driver connected to the gate of the field effect transistor.

22 Claims, 7 Drawing Sheets

| State | S1 | | S2 | | S3 | | S4 | |
|---|---|---|---|---|---|---|---|---|
| | TX | RX | TX | RX | TX | RX | TX | RX |
| State | open | closed | closed | open | closed | open | open | closed |
| Bidirectional current | yes | | yes | | yes | | | Yes |
| Block bidirectional voltage | | | | small | | small | | |
| Large common mode voltage | | | yes | | | | yes | |
| One embodiment | FQS | | Isolated gate drive | | FET | | FQS | |

FIG. 4D

SYSTEM WITH TRANSMIT-RECEIVE SWITCH

CROSS-REFERENCE TO RELATED APPLICATION(S)

The present application claims priority to and the benefit of U.S. Provisional Application No. 63/339,077, filed May 6, 2022, entitled "HIGH VOLTAGE TRANSMIT RECEIVE SWITCH", the entire content of which is incorporated herein by reference.

FIELD

One or more aspects of embodiments according to the present disclosure relate to radio systems, and more particularly to a system with a transmit/receive switch.

BACKGROUND

In various applications, it may be advantageous to transmit and receive radio signals with an electronic circuit. In some systems, a single antenna may be used both for receiving and transmitting.

It is with respect to this general technical environment that aspects of the present disclosure are related.

SUMMARY

According to an embodiment of the present disclosure, there is provided a system, including: a composite switch, the composite switch having a common port, a transmit port, and a receive port, and including: a first simple switch coupled between the common port and the receive port; and a second simple switch coupled between the common port and the transmit port, wherein: the first simple switch is a four-quadrant switch; or the second simple switch includes: a field effect transistor, and an isolated gate driver connected to the gate of the field effect transistor.

In some embodiments, the first simple switch includes two field effect transistors.

In some embodiments, the first simple switch includes a dual-gate field effect transistor.

In some embodiments, the composite switch further includes a third simple switch.

In some embodiments, the third simple switch is connected in shunt with the receive port.

In some embodiments, the composite switch further includes a fourth simple switch.

In some embodiments, the fourth simple switch is connected in shunt with the transmit port.

In some embodiments, the fourth simple switch is a four-quadrant switch.

In some embodiments, the composite switch further includes a fourth simple switch.

In some embodiments, the fourth simple switch is connected in shunt with the transmit port.

In some embodiments, the fourth simple switch is a four-quadrant switch.

In some embodiments, the system further includes a control circuit configured to cause:
  in a first state, the first simple switch to be closed and the second simple switch to be open; and in a second state, the second simple switch to be closed and the first simple switch to be open.

In some embodiments, the composite switch further includes a third simple switch.

In some embodiments, the third simple switch is connected in shunt with the receive port.

In some embodiments, the control circuit is configured to cause: in the first state, the third simple switch to be open; and in the second state, the third simple switch to be closed.

In some embodiments, the composite switch further includes a fourth simple switch.

In some embodiments, the fourth simple switch is connected in shunt with the transmit port.

In some embodiments, the fourth simple switch is a four-quadrant switch including an isolated gate driver.

In some embodiments, the control circuit is configured to cause: in the first state, the fourth simple switch to be closed; and in the second state, the fourth simple switch to be open.

In some embodiments, the composite switch further includes a fourth simple switch, connected in shunt with the transmit port.

In some embodiments, the first simple switch is a four-quadrant switch, the four-quadrant switch including an isolated gate driver.

In some embodiments, the second simple switch includes: a field effect transistor, and an isolated gate driver connected to the gate of the field effect transistor.

BRIEF DESCRIPTION OF THE DRAWINGS

These and other features and advantages of the present disclosure will be appreciated and understood with reference to the specification, claims, and appended drawings wherein:

FIG. 4D is a table of switch characteristics, according to an embodiment of the present disclosure;

DETAILED DESCRIPTION

The detailed description set forth below in connection with the appended drawings is intended as a description of exemplary embodiments of a system with a transmit/receive switch provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figures 1A, 1B:
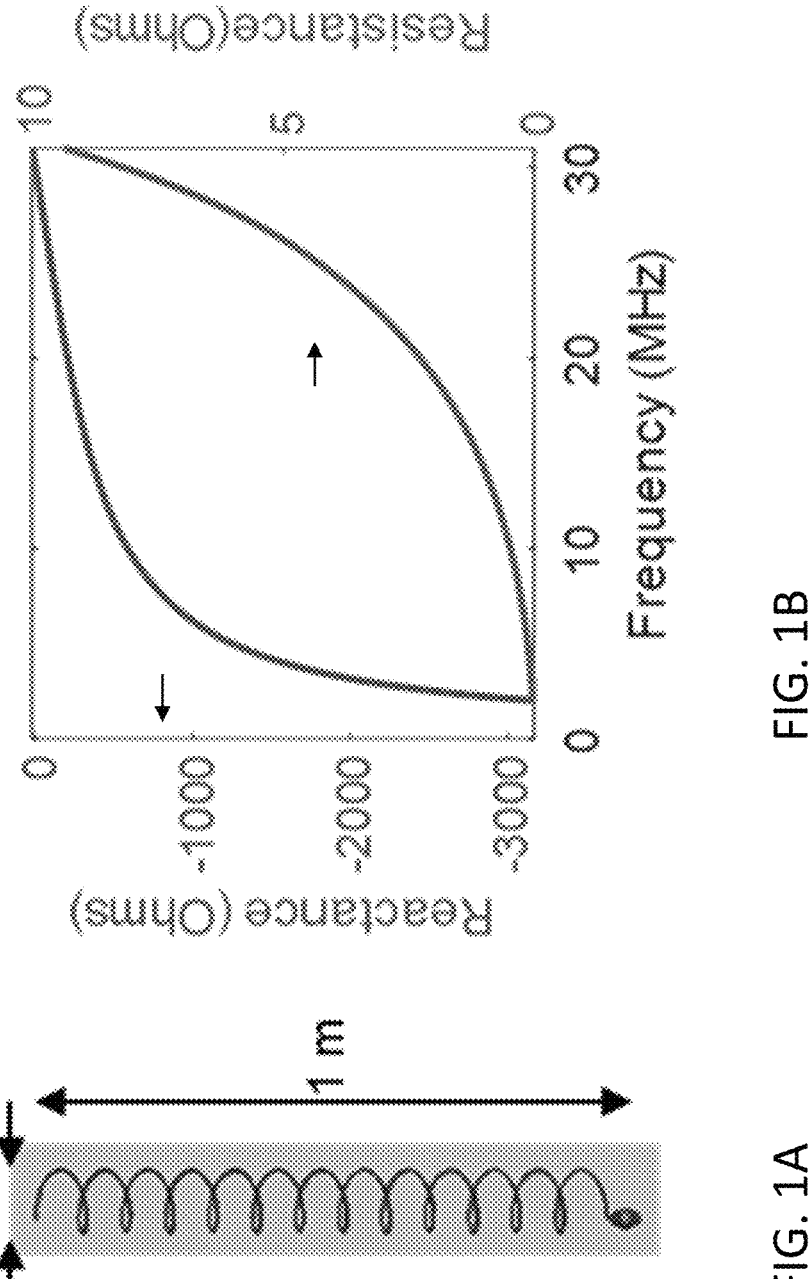
FIG. 1A is a perspective view of an antenna, according to an embodiment of the present disclosure.
FIG. 1B is a graph of impedance as a function of frequency, according to an embodiment of the present disclosure.
Figures 1C, 1D, 1E:
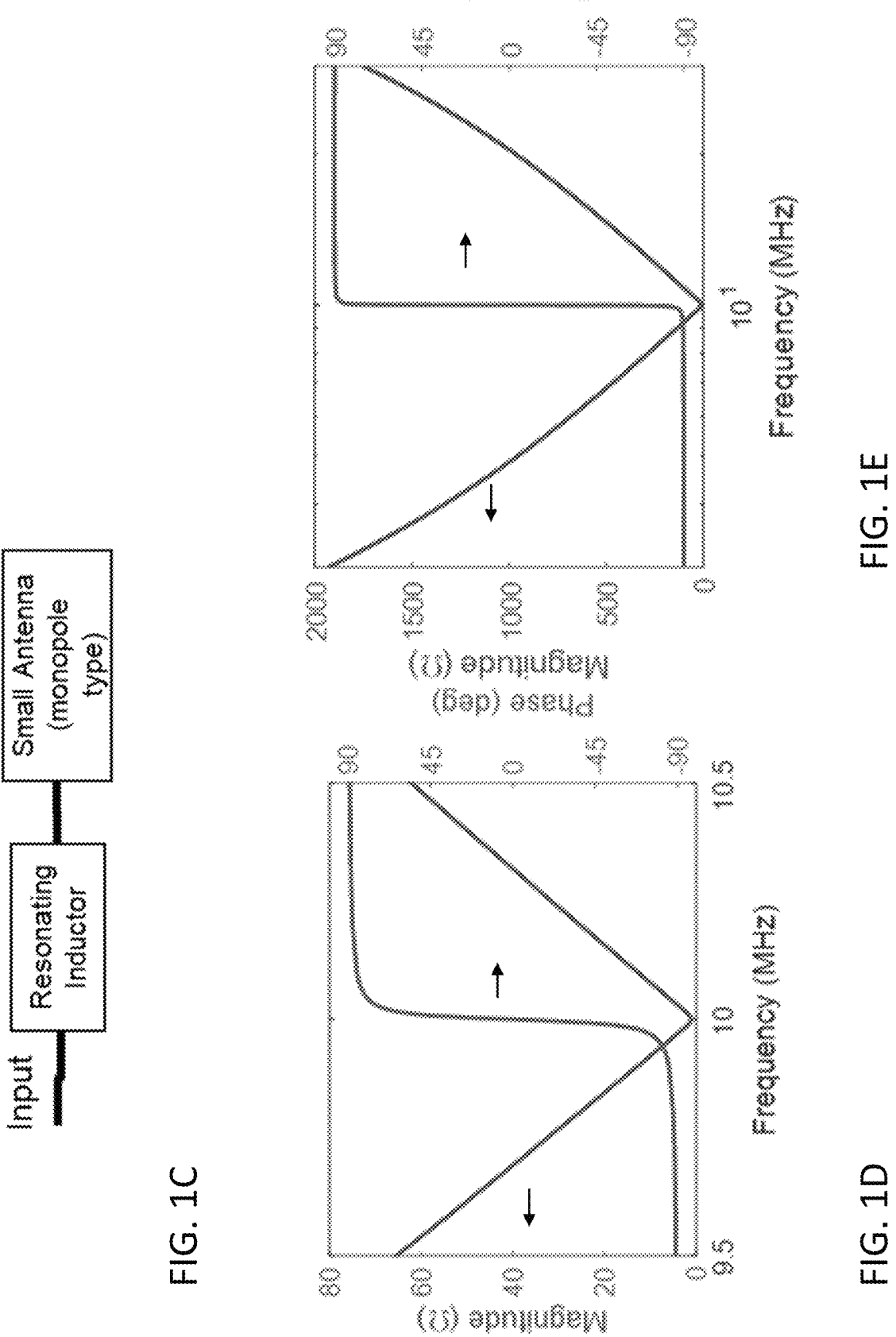
FIG. 1C is a block diagram of a load, according to an embodiment of the present disclosure.
FIG. 1D is a graph of impedance as a function of frequency, according to an embodiment of the present disclosure.
FIG. 1E is a graph of impedance as a function of frequency, according to an embodiment of the present disclosure.

In various applications (e.g., radio communications applications) it may be advantageous to drive an electrically small antenna beyond its 3 dB bandwidth. Referring to FIG. 1A, an example of a monopole type antenna, which is a normal mode helix antenna that is 1 m tall, has, at 10 MHz, a reactance of 585 ohms but a radiation resistance of only 0.5 ohms. This can be resonated at a very narrow frequency band, giving a very low impedance. Any operation outside of this band, however, may involve driving a large reactance at the band edges. For example, operation over a 1 MHz bandwidth may involve driving a reactance of up to 60 ohms. FIG. 1B shows the reactance and resistance components of the antenna, as a function of frequency. The radiation resistance at 10 MHz is approximately 0.44 ohms and the reactance of the antenna capacitance is-585 ohms. While an ideal current source can drive this high impedance, achieving this level of impedance may be difficult in practice. Furthermore, the voltage required to drive current into the antenna may become very large: I=sqrt (power/resistance), |V|=|I|*|impedance|. Therefore, it may be advantageous to resonate the antenna near a desired transmit frequency using a series inductor (FIG. 1C). Doing this may reduce the magnitude of the impedance by a factor of 9 to 10 over a large bandwidth (as shown in FIG. 1D, which is a graph of impedance of the circuit of FIG. 1C as a function of frequency), making wideband transmission with a current source practical. FIG. 1E, which is a graph of the same impedance data over the entire high frequency (HF) band, shows that the magnitude of the impedance is less than 2 kiloohms (kΩ) over the entire frequency range shown.

Figure 2:
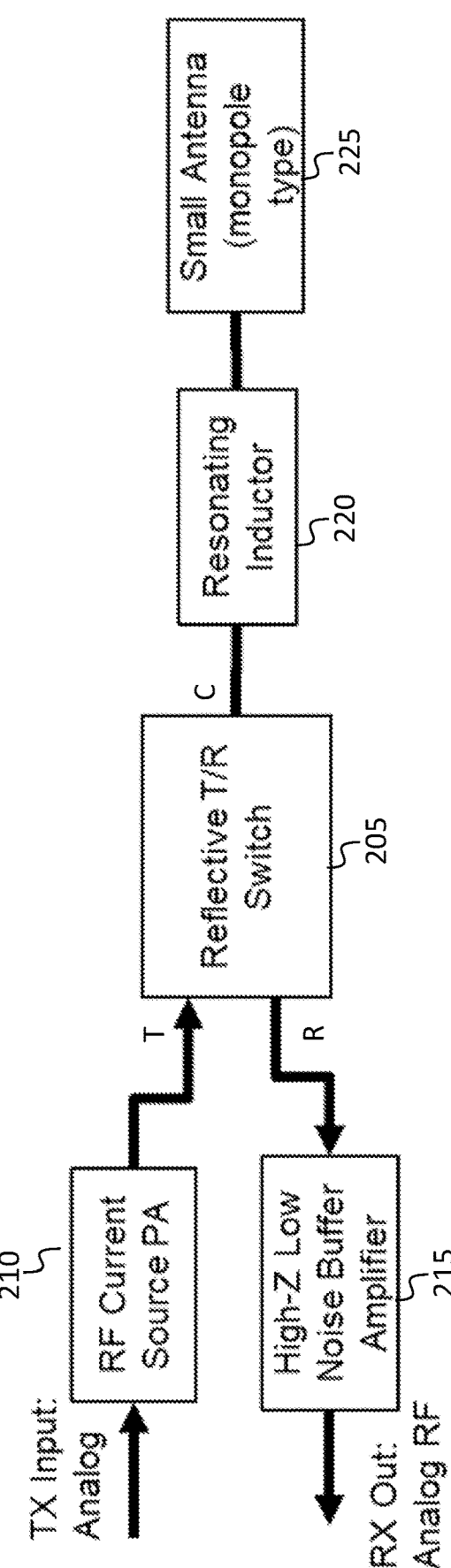
FIG. 2 is a block diagram of a system for transmitting and receiving, according to an embodiment of the present disclosure.

Referring to FIG. 2, certain components may be used, on both the transmit and receive sides, to interface with the antenna. In the embodiment of FIG. 2, a radio frequency (RF) current source power amplifier (PA) drives a desired current into the dispersive reactive load that the antenna represents. A high impedance (high-Z) low noise buffer amplifier provides good wideband reception without a conjugate match by providing a high impedance termination that senses the open circuit voltage of the antenna.

In FIG. 2, the transmit/receive (T/R) switch 205 has three sets of terminals. A first set of terminals, denoted "T", is coupled to the output of a radio frequency current source power amplifier (RFCS PA) 210, a second set of terminals, denoted "R", is coupled to the input terminals of a high impedance low-noise buffer amplifier 215, and a third set of terminals, denoted "C", for "common", is configured to be coupled to a radiating device, such a resonating inductor 220 connected in series with an antenna 225. The switch may operate in two states, or "modes". In a first mode, which may be referred to as transmit ("T") mode, the T and C terminals are coupled and the R terminals are isolated (e.g., the R terminals are not connected to the T terminals and the R terminals are not connected to the C terminals). In a second mode, which may be referred to as receive ("R") mode, the R and C terminals are coupled and the T terminals are isolated (e.g., the T terminals are not connected to the R terminals and the T terminals are not connected to the C terminals). In some embodiments, the electrical length of the connections (i) between the switch and the radio frequency current source power amplifier 210, (ii) between the switch and the high impedance low-noise buffer amplifier 215, and (iii) between the switch and the circuit (e.g., the series combination of the resonating inductor 220 and the antenna 225) connected to the C port of the transmit/receive switch 205 is less than a fifth of a wavelength (e.g., less than a tenth of a wavelength) so as to avoid standing wave behavior. Furthermore, because the radio frequency current source power amplifier 210 and the high impedance low-noise buffer amplifier 215 have high output impedance and input impedance respectively, it may be advantageous to control the parasitic shunt impedances of the transmit/receive switch 205 and of the interconnects. The transmit/receive switch 205 may be a reflective transmit/receive switch as illustrated in FIG. 2, or it may be non-reflective (e.g., the unused port may be terminated internally).

A transmit/receive (T/R) switch capable of operating in such a high impedance environment may be used to construct a system suitable for both transmitting and receiving. The high impedance or small antenna environment may require high voltages to drive high radiated power. Since the radiation resistance is only 0.5 ohm, radiating just 1 W may require a current amplitude of 2 A, which into 60 ohms corresponds to a voltage amplitude of 120 V (significantly more than the 10 V which corresponds to 1 W in a 50 ohm system). Radiating 4 W may require double this amplitude, or 240 V (significantly more than the 20 V which corresponds to 4 W in a 50 ohm system). An amplitude of 240 V may be too great for some FET switches to handle.

Figure 3C:
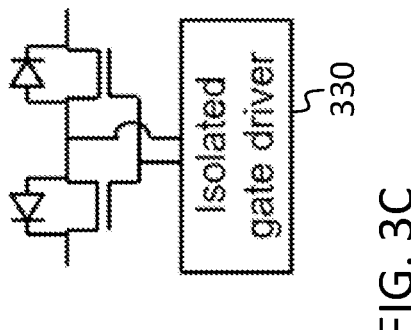
FIG. 3C is a schematic diagram of a four-quadrant switch, according to an embodiment of the present disclosure.

As mentioned above, the transmit/receive switch 205 may selectively couple a transmitter or a receiver to a communication channel (e.g., a resonated antenna). FIG. 3A shows a transmit/receive switch 205 in some embodiments. In the embodiment of FIG. 3A, either switch S1 or switch S2 (but not both) is closed at a given time, coupling the common port to either the receive port or the transmit port. Each of the switches S1 and S2 (each of which may be a single-pole single-throw (SPST) switch (e.g., a semiconductor SPST switch, as illustrated in some of the examples discussed below) may be referred to as a "simple" switch; the transmit/receive switch 205, which may include a plurality of such simple switches may be referred to as a "composite" switch. In a practical switch, a shunt capacitance may provide a leakage path across an open switch. To mitigate such leakage, a series-shunt topology, such as that illustrated in FIG. 3D, may be used. In FIG. 3D, S1 and S4 share the same logic (e.g., they share a control signal so that at any time either both are closed or both are open) and S2 and S3 share the same logic. In the state shown, the leakage through open switch S2 is shunted by closed switch S4 to further isolate the transmit port from the receive port. This may be useful in mitigating parasitic resonances that could occur between the off-state capacitance of S2 and the impedance loading the transmit port. Such resonances could negatively affect transmission from the common port to the receive port.

Figure 3B:
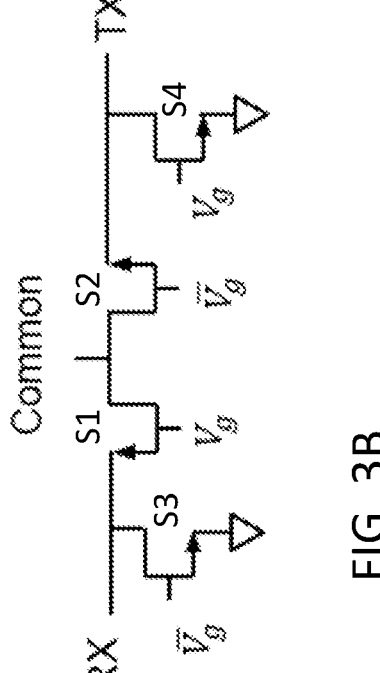
FIG. 3B is a schematic diagram of a transmit/receive switch including four field effect transistors (FETs), according to an embodiment of the present disclosure.
Figure 3A:
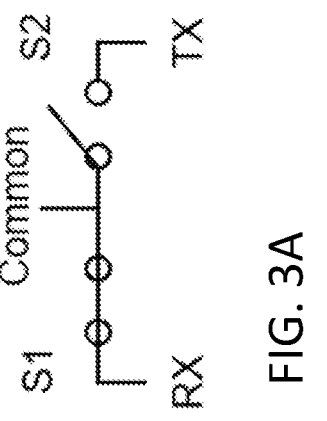
FIG. 3A is a schematic diagram of a transmit/receive switch including two single-pole single throw switches, according to an embodiment of the present disclosure.
Figure 3D:
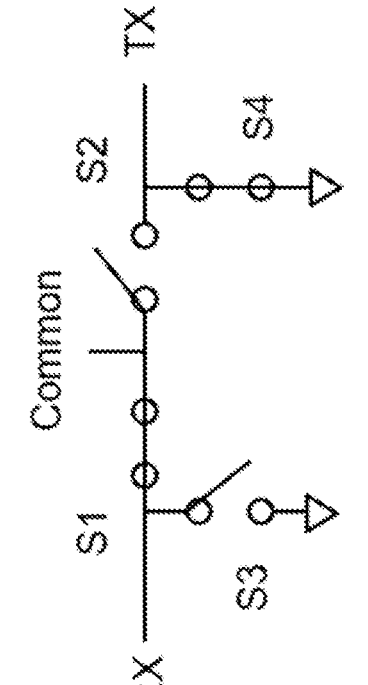
FIG. 3D is a schematic diagram of a transmit/receive switch including four single-pole single throw switches, according to an embodiment of the present disclosure.

In an RF system the simple switches may be implemented with field effect transistors (FETs) (as illustrated in FIG. 3B) by applying voltages to the gates of the transistors through large bias resistors (not shown). Such a transistor switch may be turned on (i.e., the switch may be closed) by either gate-source or gate-drain voltage. When the transmit/receive switch 205 is in the transmitting state, S3 may be closed and S1 may be open. The source of S1 may then be grounded and the drain of S1 varies between a positive voltage and a negative voltage with the transmit voltage, which may have an amplitude Vrf. Therefore, for S1 to remain open, it may be required that the gate voltage be sufficiently negative that Vrf (with amplitude VRF) does not turn on S1 during the negative part of the cycle. In the example of FIG. 3B, this may mean that that gate of S1 may be at −VRF, which may not be a convenient logic voltage to generate, and the switch may need to withstand as much as 2*VRF during the positive cycle of the transmit waveform. If the RF voltage is 240 V, then the gate may need to be biased as low as −240 V and the gate-drain junction may need to withstand as much as 480V.

In some embodiments, the gate of at least one of the FETs may be driven by an isolated gate driver 330, as illustrated in FIG. 3C. The isolated gate driver 330 may include an isolated direct current to direct current (DC/DC) converter (which may include, as an isolated coupling element, a transformer, a capacitor, or an optical coupling element (e.g., an opto isolator, or a combination of a fiber-coupled laser or light-emitting diode and a fiber-coupled photodiode)). The isolated gate driver 330 may be connected across the gate-source junction of the FET and may be floating relative to a ground potential, allowing the gate source junction to be turned on or off by differential voltages independent of the common mode voltage. The isolated gate driver 330 may have two primary functions: (i) converting a logic-level signal into gate drive voltage and current for turning the FET on and off and (ii) providing galvanic isolation. The example shown in FIG. 3C uses a gate driver and two FETs to form a four-quadrant switch (FQS). In this case, the four-quadrant switch is capable of standing off voltage in either direction up to the breakdown voltage of one of the FETs.

Figure 4C:
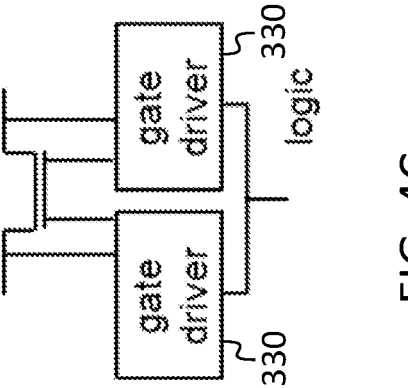
FIG. 4C is a schematic diagram of a four-quadrant switch, according to an embodiment of the present disclosure.
Figure 4B:
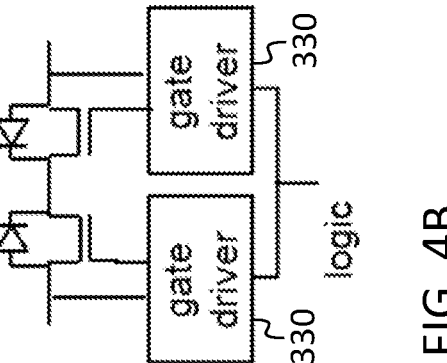
FIG. 4B is a schematic diagram of a four-quadrant switch, according to an embodiment of the present disclosure.
Figure 4A:
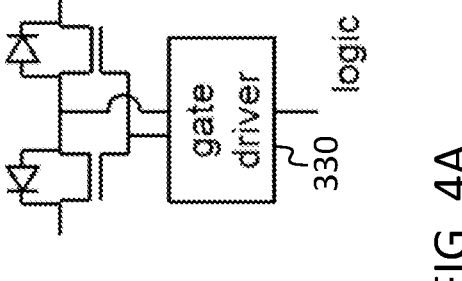
FIG. 4A is a schematic diagram of a four-quadrant switch, according to an embodiment of the present disclosure.

FIGS. 4A-4C show three configurations of the four-quadrant switch. The common source configuration (illustrated in FIG. 4A and in FIG. 3C) uses a single isolated gate driver 330 for a pair of FETs with their sources connected and the drains connected to the external circuit. In one direction one of the FETs blocks current and stands off the voltage, and in the other direction the other one of the FETs blocks the current and stands off the voltage. The common drain configuration illustrated in FIG. 4B is similar to the common source configuration except that the drains are connected to a common node. The common drain configuration may be constructed using two isolated gate drivers, as shown. A dual-gate FET (illustrated in FIG. 4C) may have two gates on a single channel, and may exhibit behavior similar to the common drain configuration.

In transmit mode, the switch may serve three functions: (i) coupling the transmit current through the common port, (ii) isolating the common port from parasitic loading by the circuit connected to the receive port and (iii) protecting the receive circuit (e.g., the high impedance low noise buffer amplifier) from excessive voltage. In the receive mode, the switch serves to (i) couple the receive signal from the common port to the receiver and (ii) isolate the common port from parasitic loading by the circuit connected to the transmit port. These functions flow down to each of the switches in the table of FIG. 4D, where it is understood that S1 and S2 are present, while S3 and S4 are optional. The table of FIG. 4D shows that first, all of the switches must pass bidirectional current; this may be achievable with most (e.g., with all) FETs. S1 may be selected to block high bidirectional voltage in the transmit mode, and therefore, S1 may be a four-quadrant switch. The table of FIG. 4D further shows that S2 has a large common mode voltage in the transmit mode, and therefore may be selected to have an isolated gate drive. S2 may be selected to be capable of blocking bidirectional voltage in the receive mode; however, the receive voltages may be small and may not be strong enough to turn on S2. S3, if included, may only be required to block small voltages in the receive mode, and therefore, a conventional FET may be selected for use as S3. S4, if included, may be required to block the high transmit voltage, and therefore it may be selected to be a four-quadrant switch.

Figures 5A, 5B, 5C, 5D:
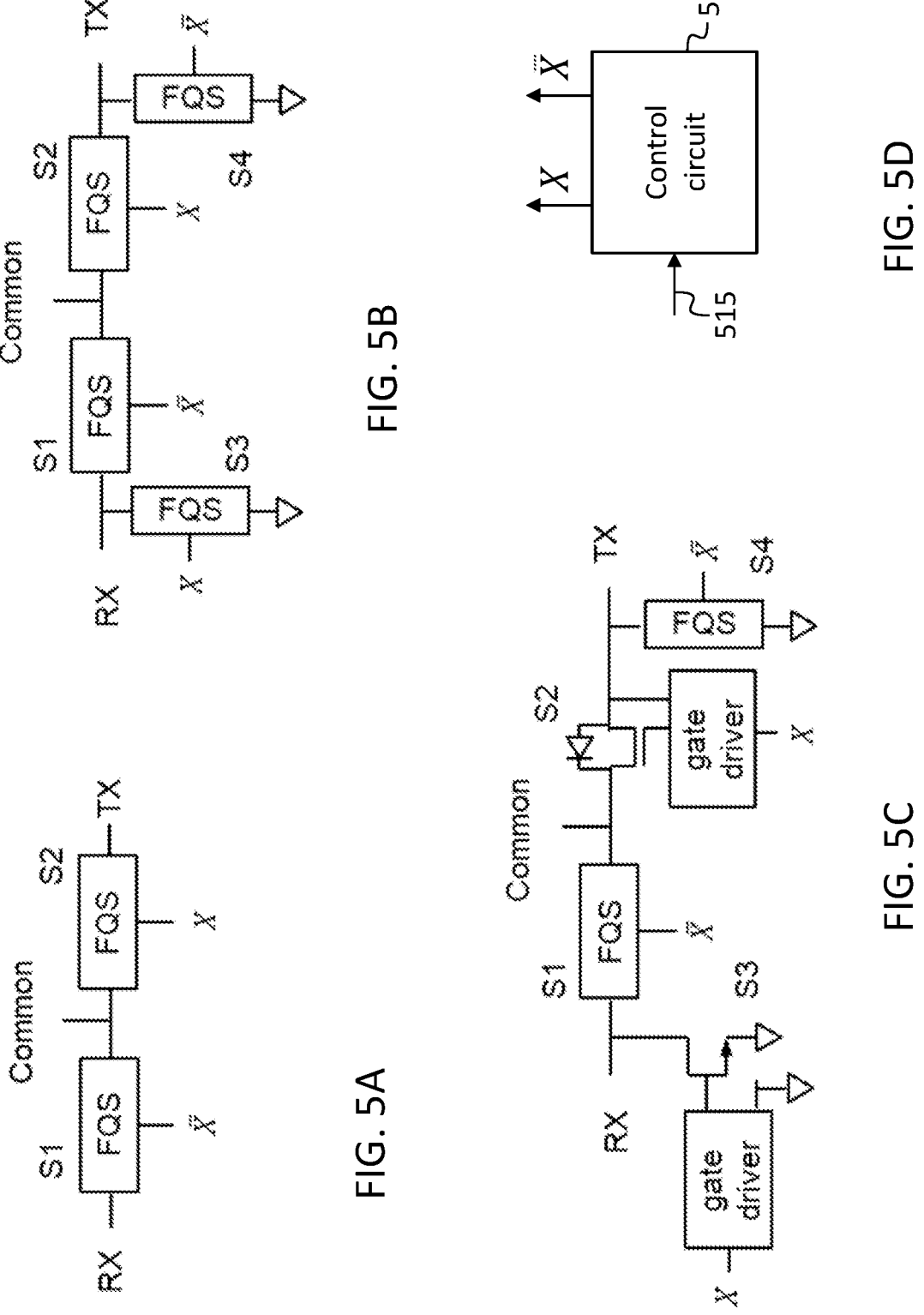
FIG. 5A is a schematic diagram of a transmit/receive switch, according to an embodiment of the present disclosure.
FIG. 5B is a schematic diagram of a transmit/receive switch, according to an embodiment of the present disclosure.
FIG. 5C is a schematic diagram of a transmit/receive switch, according to an embodiment of the present disclosure.
FIG. 5D is a block diagram of a control circuit for a transmit/receive switch, according to an embodiment of the present disclosure.

Various combinations may be constructed based on the table of FIG. 4D. Some configurations are shown in FIG. 5. The embodiment of FIG. 5A includes two four-quadrant switches as the first and second switches. Because each four-quadrant switch includes an isolated driver, this is within the scope of the minimum embodiment (the embodiment lacking both S3 and S4). Isolation may be improved with a series-shunt embodiment as in the embodiment of FIG. 5B. In this embodiment, all switches are four-quadrant switches. Because some four-quadrant switches put two switches in series and use isolated gate drivers 330, they may not be ideal from a standpoint of performance or simplicity. According to the table of FIG. 4D, it is apparent that, as illustrated in FIG. 5C, S2 may be replaced by a single FET switch with an isolated gate driver 330, and S3 may be replaced by a single FET, where the gate driver may not need to be isolated since the FET is grounded. Embodiments including the simple switch S3 (such as the embodiments of FIGS. 5B and 5C) may be selected in applications in which the receiver is sensitive and increasing isolation to the receiver is important. In each of the embodiments of FIGS. 5A-5C, complementary control signals X and X may be used to control the simple switches S1 and S2 (and, if present, S3 and S4). These complementary control signals may be generated by a control circuit 510, e.g., based on an input signal 515 received by the control circuit 510, or based on an algorithm executed internally to the control circuit 510. The control circuit 510 may be a processing circuit (discussed in further detail below).

The four-quadrant switches may include FETs (as illustrated in FIGS. 4A and 4B, for example). These FETs may be MOSFETs, JFETS, HEMTs, or other FETS made of silicon, SiC, GaN, GaAs, InP or made using other (e.g., future) technologies. The FETs may be selected according to the voltage and current stress, for example by selecting the size and technology accordingly. For example, (i) S1 and S4 may be required to stand off high voltage, and therefore may need to have high breakdown voltages, (ii) S2 may pass high current but not high voltage, and (iii) S3 may have lower requirements for both voltage and current. Particularly for high impedance loads, it may be desirable to minimize switch off-capacitance for S1-S4 which may provide shunt current paths. The off-capacitance of S3 and S2 may degrade the gain in the receive mode. The off-capacitances of S1 and S4 may draw excess current from a transmitter in the transmit mode, which may reduce the efficiency and/or cause increased thermal or voltage stress to S3 and/or a receiver.

In some examples, the electrical size of the entire transmit/receive switch 205 may be much smaller than a wavelength, and, in such an example, the distance between any two of the three circuits (e.g., the radio frequency current source power amplifier, the high impedance low noise buffer amplifier, and the antenna or the resonated antenna) connected to the three ports of the transmit/receive switch 205 may be much smaller than a wavelength. In other examples, the size of the switch core is much smaller than a wavelength (e.g., the separation between any two of the simple switches of the transmit/receive switch 205 may be much smaller than a wavelength), although there may be additional transmission line length between the ports and the switches.

As used herein, a "simple switch" is a switch, having two terminals, that allows current to flow between the two terminals when closed, and does not allow current to flow between the two terminals when open. A simple switch may include more than one simple switch; for example, the four-quadrant switch of FIG. 3C, which includes two FETs each configured as a simple switch, is a simple switch as that term is used herein. A "composite switch" is a switch having three or more terminals, such as the transmit/receive switch 205 of FIG. 3A.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X-Y and the second quantity is at most X+Y. As used herein, when a second number is "within Y %" of a first number, it means that the second number is at least $(1-Y/100)$ times the first number and the second number is at most $(1+Y/100)$ times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

It will be understood that when an element is referred to as being "directly connected" or "directly coupled" to another element, there are no intervening elements present. As used herein, "operatively coupled" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Although exemplary embodiments of a system with a transmit/receive switch have been specifically described and illustrated herein, many modifications and variations will be apparent to those skilled in the art. Accordingly, it is to be understood that a system with a transmit/receive switch constructed according to principles of this disclosure may be embodied other than as specifically described herein. The invention is also defined in the following claims, and equivalents thereof.

What is claimed is:

1. A system, comprising:
a composite switch,
the composite switch having a common port, a transmit port, and a receive port, and comprising:
a first simple switch coupled between the common port and the receive port; and
a second simple switch coupled between the common port and the transmit port,
the composite switch being configured:
in a first state, to couple the receive port and the common port and to isolate the transmit port, and
in a second state, to couple the transmit port and the common port and to isolate the receive port,
wherein:
the first simple switch is a four-quadrant switch; or the second simple switch comprises:
a field effect transistor, and
an isolated gate driver connected to the gate of the field effect transistor.

2. The system of claim 1, wherein the first simple switch comprises two field effect transistors.

3. The system of claim 1, wherein the first simple switch comprises a dual-gate field effect transistor.

4. The system of claim 3, wherein the composite switch further comprises a fourth simple switch.

5. The system of claim 4, wherein the fourth simple switch is connected in shunt with the transmit port.

6. The system of claim 5, wherein the fourth simple switch is a four-quadrant switch.

7. The system of claim 1, wherein the composite switch further comprises a third simple switch.

8. The system of claim 7, wherein the third simple switch is connected in shunt with the receive port.

9. The system of claim 1, wherein the composite switch further comprises a fourth simple switch.

10. The system of claim 9, wherein the fourth simple switch is connected in shunt with the transmit port.

11. The system of claim 10, wherein the fourth simple switch is a four-quadrant switch.

12. The system of claim 1, further comprising a control circuit configured to cause:
in the first state, the first simple switch to be closed and the second simple switch to be open; and
in the second state, the second simple switch to be closed and the first simple switch to be open.

13. The system of claim 12, wherein the composite switch further comprises a third simple switch.

14. The system of claim 13, wherein the third simple switch is connected in shunt with the receive port.

15. The system of claim 14, wherein the control circuit is configured to cause:
in the first state, the third simple switch to be open; and
in the second state, the third simple switch to be closed.

16. The system of claim 15, wherein the composite switch further comprises a fourth simple switch.

17. The system of claim 16, wherein the fourth simple switch is connected in shunt with the transmit port.

18. The system of claim 17, wherein the fourth simple switch is a four-quadrant switch comprising an isolated gate driver.

19. The system of claim 18, wherein the control circuit is configured to cause:
in the first state, the fourth simple switch to be closed; and
in the second state, the fourth simple switch to be open.

20. The system of claim 12, wherein the composite switch further comprises a fourth simple switch, connected in shunt with the transmit port.

21. The system of claim 1, wherein the first simple switch is a four-quadrant switch, the four-quadrant switch comprising an isolated gate driver.

22. The system of claim 1, wherein the second simple switch comprises:
a field effect transistor, and
an isolated gate driver connected to the gate of the field effect transistor.

* * * * *